(12) United States Patent
Kim et al.

(10) Patent No.: US 9,923,159 B2
(45) Date of Patent: Mar. 20, 2018

(54) THIN FILM TRANSISTOR, METHOD OF MANUFACTURING SAME, AND ELECTRONIC DEVICE INCLUDING THIN SAME

(71) Applicant: Samsung Electronics Co., Ltd., Suwon-si, Gyeonggi-do (KR)

(72) Inventors: Joo Young Kim, Hwaseong-si (KR); Jiyoung Jung, Seoul (KR); Jeong Il Park, Seongnam-si (KR); Woo Young Yang, Hwaseong-si (KR); Youngjun Yun, Yongin-si (KR); Eun Kyung Lee, Seoul (KR); Ajeong Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/131,165

(22) Filed: Apr. 18, 2016

(65) Prior Publication Data
US 2017/0098792 A1  Apr. 6, 2017

(30) Foreign Application Priority Data
Oct. 6, 2015 (KR) .................. 10-2015-0140544

(51) Int. Cl.
*H01L 51/00* (2006.01)
*H01L 51/05* (2006.01)

(52) U.S. Cl.
CPC ...... *H01L 51/0533* (2013.01); *H01L 51/0003* (2013.01); *H01L 51/0005* (2013.01); *H01L 51/0011* (2013.01)

(58) Field of Classification Search
CPC ............ H01L 51/0533; H01L 51/0002; H01L 51/0003; H01L 51/052; H01L 2924/0715; H01L 21/02216
See application file for complete search history.

(56) References Cited

U.S. PATENT DOCUMENTS

| 5,854,141 | A | 12/1998 | Cronin et al. |
| 6,529,251 | B2 | 3/2003 | Hibino et al. |
| 7,692,184 | B2 * | 4/2010 | Koinuma ............... B82Y 10/00 257/40 |
| 7,816,673 | B2 | 10/2010 | Park et al. |

(Continued)

FOREIGN PATENT DOCUMENTS

| JP | 2008130910 A | * | 6/2008 |
| JP | 2008298862 A | * | 12/2008 |

(Continued)

*Primary Examiner* — Yu Chen
*Assistant Examiner* — Pauline Vu
(74) *Attorney, Agent, or Firm* — Harness, Dickey & Pierce, P.L.C.

(57) ABSTRACT

A thin film transistor includes a gate electrode, a semiconductor overlapping the gate electrode, a gate insulator between the gate electrode and the semiconductor, and a source electrode and a drain electrode electrically connected to the semiconductor, wherein the gate insulator includes an inorganic insulation layer facing the gate electrode and an organic insulation layer facing the semiconductor. A method of manufacturing the thin film transistor and an electronic device including the thin film transistor are provided.

17 Claims, 8 Drawing Sheets

(56) References Cited

U.S. PATENT DOCUMENTS

| | | | |
|---|---|---|---|
| 2005/0189536 A1* | 9/2005 | Zschieschang | B82Y 10/00 257/40 |
| 2005/0285102 A1* | 12/2005 | Koo | H01L 51/0529 257/40 |
| 2006/0006381 A1* | 1/2006 | Kelley | H01L 51/0545 257/40 |
| 2006/0151781 A1* | 7/2006 | Kim | H01L 51/0529 257/40 |
| 2007/0051947 A1* | 3/2007 | Nakayama | H01L 51/0529 257/40 |
| 2007/0181873 A1 | 8/2007 | Moon et al. | |
| 2008/0001151 A1* | 1/2008 | Jun | H01L 29/4908 257/59 |
| 2008/0149922 A1* | 6/2008 | Lin | H01L 29/4908 257/40 |
| 2009/0156774 A1* | 6/2009 | Ziche | C08G 18/0895 528/28 |
| 2009/0166611 A1* | 7/2009 | Ohta | H01L 21/02123 257/40 |
| 2009/0197055 A1* | 8/2009 | Yokoi | C08L 83/12 428/195.1 |
| 2011/0196059 A1* | 8/2011 | Nagai | C07F 7/21 522/172 |
| 2012/0056249 A1* | 3/2012 | Mueller | C08F 232/00 257/288 |
| 2015/0004113 A1* | 1/2015 | Ritter | C08L 83/08 424/70.12 |
| 2015/0203708 A1* | 7/2015 | Klun | C07F 7/1868 428/447 |
| 2016/0035855 A1* | 2/2016 | Marks | H01L 29/4908 257/40 |
| 2016/0061997 A1* | 3/2016 | Kamohara | G02B 1/118 428/323 |

FOREIGN PATENT DOCUMENTS

| | | | |
|---|---|---|---|
| JP | 2013035274 A | * | 2/2013 |
| KR | 20140055606 A | | 5/2014 |
| WO | WO 2013182328 A1 | * | 12/2013 |

* cited by examiner

THIN FILM TRANSISTOR, METHOD OF MANUFACTURING SAME, AND ELECTRONIC DEVICE INCLUDING THIN SAME

CROSS-REFERENCE TO RELATED APPLICATION

This application claims priority to and the benefit of Korean Patent Application No. 10-2015-0140544, filed in the Korean Intellectual Property Office on Oct. 6, 2015, the entire contents of which are incorporated herein by reference.

BACKGROUND

1. Field

A thin film transistor, a method of manufacturing the same, and an electronic device including the thin film transistor are disclosed.

2. Description of the Related Art

A flat panel display such as a liquid crystal display (LCD), an organic light emitting diode (OLED) display, an electrophoretic display, and the like typically includes a pair of electric field-generating electrodes and an electrical optical active layer interposed therebetween. The liquid crystal display (LCD) typically includes a liquid crystal layer as an electric optical active layer, and the organic light emitting diode (OLED) display includes an organic emission layer as an electrical optical active layer.

One out of the pair of electric field-generating electrodes is commonly connected to a switching device and receives an electrical signal, and the electrical optical active layer transforms the electrical signal into an optical signal and thus displays an image.

The flat panel display includes a thin film transistor (TFT) that is a three-terminal element as a switch. Research on an organic thin film transistor (OTFT) including an organic semiconductor such as a low molecular semiconductor or a polymer semiconductor (instead of an inorganic semiconductor such as a silicon (Si) semiconductor) as one kind of thin film transistor is being actively conducted.

The organic thin film transistor may be made into a fiber or a film due to characteristics of an organic material, and thus is drawing attention as a core element for a flexible display device. In order to apply an organic thin film transistor in a flat panel display such as OLED, LCD or the like, it is desirable to satisfy the various reliability evaluations to maintain the same quality, even if the flat panel display is used for a long time.

SUMMARY

One example embodiment relates to a thin film transistor satisfying a high enough reliability to maintain the same quality even if the thin film transistor is used for a long time.

Another example embodiment relates to a method of manufacturing the thin film transistor.

Another example embodiment relates to an electronic device including the thin film transistor.

According to one example embodiment, a thin film transistor includes a gate electrode, a semiconductor overlapped with the gate electrode, a gate insulator between the gate electrode and the semiconductor, and a source electrode and a drain electrode electrically connected to the semiconductor, wherein the gate insulator includes an inorganic insulation layer facing the gate electrode and an organic insulation layer facing the semiconductor.

The inorganic insulation layer may include at east one of SiOx, SiNx, AlOx, and a combination thereof.

The organic insulation layer may include at least one organic polymer selected from poly(methyl methacrylate) (PMMA), polyvinylpyrrolidone (PVP), polyvinylacetate (PVA), polyimide (PI), polyethylene naphthalate, polyethylene terephthalate, polycarbonate, polyvinylbutyral, polynorbornene, and polyether sulfone, or a siloxane-based organic/inorganic hybrid copolymer.

The organic insulation layer may include poly(methyl methacrylate) (PMMA).

The organic insulation layer may include a siloxane-based organic/inorganic hybrid copolymer.

The inorganic insulation layer may have a thickness that is less than or equal to about 200 nm.

The organic insulation layer may have a thickness that is less than or equal to about 200 nm.

The gate electrode may be disposed on a substrate and the thin film transistor may further include at least one of self-assembled monolayer (SAM), a HMDS (hexamethyldisilazane) film, and a fluorine-based organic thin film between the organic insulation layer facing the semiconductor and the semiconductor.

The substrate may be or include a silica, glass, or plastic substrate.

The semiconductor may be or include an organic semiconductor.

Another example embodiment relates to a method of manufacturing a thin film transistor that includes providing a gate electrode, providing a gate insulator on the gate electrode, providing an organic semiconductor on the gate insulator, providing a source electrode and a drain electrode electrically connected to the organic semiconductor on the organic semiconductor, wherein providing the gate insulator on the gate electrode includes providing an inorganic insulation layer on the gate electrode and providing an organic insulation layer on the inorganic insulation layer.

Further, another example embodiment relates to a method of manufacturing a thin film transistor including providing an organic semiconductor; providing a source electrode and a drain electrode electrically connected to both ends of the organic semiconductor, respectively, providing a gate insulator on the source electrode and the drain electrode and the organic semiconductor, and providing a gate electrode on the gate insulator, wherein providing the gate insulator includes providing an organic insulation layer on the source electrode and the drain electrode and the organic semiconductor. and providing an inorganic insulation layer on the organic insulation layer.

The inorganic insulation layer may be provided by depositing at least one of SiOx, SiNx, AlOx, and a combination thereof in a thickness that is less than or equal to about 200 nm using a plasma enhanced chemical vapor deposition (PECVD) method or an atomic layer deposition method (ALD).

The organic insulation layer may be provided by coating at least one organic polymer selected from poly(methyl methacrylate) (PMMA), polyvinylpyrrolidone (PVP), polyvinylacetate (PVA), polyimide (PI), polyethylene naphthalate, polyethylene terephthalate, polycarbonate, polyvinylbutyral, polynorbornene, and polyether sulfone, or a siloxane-based organic/inorganic hybrid copolymer.

The organic semiconductor may be provided by a solution coating or deposition.

The method may further include forming a self-assembled monolayer (SAM), a HMDS (hexamethyldisilazane) film, or a fluorine-based organic thin film on the organic insulation layer.

Another example embodiment relates to an electronic device including the thin film transistor.

The electronic device may include a liquid crystal display (LCD), an organic light emitting diode device, an electrophoretic display, or an organic sensor, according to an example embodiment.

Example embodiments relate to a transistor including a substrate, a semiconductor on the substrate, a gate insulator in contact with the semiconductor, a gate electrode in contact with the gate insulator, at least one of a source electrode and a drain electrode electrically connected to the semiconductor. In example embodiments, the gate insulator includes an inorganic insulation layer in contact with the gate electrode and an organic insulation layer in contact with the semiconductor.

DETAILED DESCRIPTION

Figure 1:
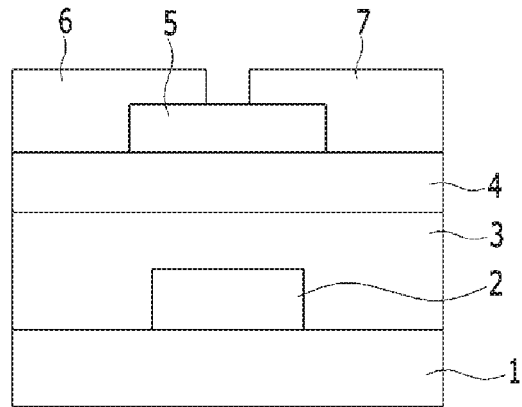
FIG. 1 is a cross-sectional view showing a thin film transistor according to an example embodiment.

The example embodiments will be described more fully hereinafter with reference to the accompanying drawings, in which example embodiments of this disclosure are shown. However, this disclosure may be embodied in many different forms and is not construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawings, the thickness of layers, films, panels, regions, etc., are exaggerated for clarity. Like reference numerals designate like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

For evaluating a TFT element for operating a display panel such as OLED, LCD, there are various reliability evaluations in order to test whether the TFT element maintains the same quality over long time use. For example, it may include hysteresis, breakdown voltage, HCI (hot carrier instability), NBTI (negative bias temperature instability), or the like.

Among them, the NBTI is an evaluation for testing whether the threshold voltage change is minimized, which includes applying voltage corresponding to a desired, or alternatively predetermined electric field (i.e., in 1 to 2 MV/cm, that is, 10 V to 20 V is applied for a gate insulator having a thickness of 100 nm) between the gate electrode and the source-drain electrode of the TFT device at a high temperature for a substantial amount of time, and measuring the $V_{TH}$ (threshold voltage) change before and after the stress.

The NBTI evaluation is to confirm the phenomenon that $V_{TH}$ is shifted by the trap charges at the interface between an active layer (semiconductor layer) and a gate insulator layer, and is a reliability evaluation reference for ensuring TFT to be normally operated even when using the display device for a substantial amount of time.

Meanwhile, the TFT element for a flexible display and a wearable device has been studied to employ OFET (Organic Field Effect Transistor) using an organic semiconductor instead of an inorganic material to ensure the flexibility. But, as the insulator, as well as the active layer, is also beneficial to use an organic insulation layer instead of the inorganic insulation layer such as SiOx, SiNx or the like. The flexible insulation layer may include a polymer insulation layer such as PMMA, PVP, PVA, polyimide and the like or a siloxane-based organic/inorganic hybrid insulation layer.

Recently, an organic insulation layer showing excellent electrical stability and high performance when applied as a gate insulating layer in an OFET has been reported, but the organic insulation layer has problems of excessively passing the evaluation reference boundary when applying the severe reliability evaluation reference such as NBTI (e.g., increasing the threshold voltage ($V_{TH}$) difference to greater than or equal to about 10 V before and after the NBTI stress).

A thin film transistor according to one example embodiment includes a gate electrode, a semiconductor overlapped with the gate electrode, a gate insulator between the gate electrode and the semiconductor, and a source electrode and a drain electrode electrically connected to the semiconductor, wherein the gate insulator includes an inorganic insulation layer facing the gate electrode and an organic insulation layer facing the semiconductor.

Accordingly, the thin film transistor in which the gate insulator is formed in a double layer structure of an inorganic insulation layer disposed on the side of the gate electrode and an organic insulation layer disposed on the side of the semiconductor reduces or substantially suppresses the bulk trap charging in the gate insulator. In addition, by reducing or substantially suppressing the bulk trap charging, the interface trap charging is also reduced or substantially suppressed at the interface between the organic insulation layer and the semiconductor. Accordingly, as the thin film transistor according to one example embodiment effectively reduces or substantially suppresses both the bulk trap charging and the interface trap charging in the gate insulator, the threshold voltage $V_{TH}$ difference remains within about 1V even if stressed under the severe conditions of NBTI as understood in Example 1 and Example 2 described later, so as to provide excellent NBTI characteristic.

On the other hand, unlike the thin film transistor according to the example embodiment, it is understood that the $V_{TH}$ difference after the NBTI test, in the case of the thin film transistors according to Comparative Example 1 in which the gate insulator simply includes only organic insulating film and Comparative Example 2, is about 10V which is more than 10 times than in Example 1 and Example 2.

Resultantly, it is understood that the thin film transistor, in which the gate insulator is formed in a double insulation layer structure of an inorganic insulation layer and an organic insulation layer, has a high reliability of maintaining a high quality for a long time operation.

Hereinafter, a thin film transistor according to one example embodiment is described in detail referring to the drawings.

FIG. 1 is a cross-sectional view showing a thin film transistor according to an example embodiment.

Referring to FIG. 1, a gate electrode 2 is formed on a substrate 1.

The substrate 1 may be made of or include, for example, transparent glass, silicon, or a polymer. The gate electrode 2 is connected to a gate line (not shown) transmitting a data signal, and may be made of or include, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

A gate insulator is formed on gate electrode 2. As described above, the gate insulator includes an inorganic insulation layer 3 formed facing the gate electrode 2 and an organic insulation layer 4 formed facing the inorganic insulation layer 3.

The inorganic insulation layer 3 may be made of or include an inorganic material of silicon oxide (SiOx), silicon nitride (SiNx), aluminum oxide (AlOx), and the like.

The organic insulation layer 4 may be made of or include a polymer material, such as, polymethyl(meth)acrylate (PMMA), polyvinylpyrrolidone (PVP), polyvinylacetate (PVA), polyimide (PI), polyethylene naphthalate, polyethylene terephthalate, polycarbonate, polyvinylbutyral, polynorbornene, polyvinyl alcohol, polystyrene compound, polyether sulfone, benzocyclobutane (BCB), fluoro polymer, and the like, or a siloxane-based organic/inorganic hybrid copolymer.

An organic semiconductor 5 is formed on the organic insulation layer 4. The organic semiconductor 5 may be disposed at a position overlapping with the gate electrode 2 about the center of the gate insulator in a direction substantially perpendicular to a longitudinal surface of the substrate 1, and may have the shape of, for example, an island.

The organic semiconductor 5 may be made of or include a low molecular or polymer compound, and for example, may include at least one of pentacene and derivatives thereof, tetrabenzoporphyrin and a precursor thereof, polyphenylenevinylene and a precursor thereof, polyfluorene and a precursor thereof, polythienylenevinylene and a precursor thereof, polythiophene and a precursor thereof, polythienothiophene and a precursor thereof, polyarylamine and a precursor thereof, phthalocyanine and a precursor thereof, metallized phthalocyanine or a halogenated derivative thereof, perylenetetracarboxylic dianhydride (PTCDA), naphthalenetetracarboxylic dianhydride (NTCDA) or an imide derivative thereof, perylene or coronene, and substituent-containing derivatives thereof, and heteroacene or derivatives thereof.

The organic semiconductor 5 may be formed, for example, using a deposition method, and the deposited organic semiconductor material may be a low molecular organic semiconductor material such as, for example, pentacene or a pentacene derivative, tetrabenzoporphyrin or a tetrabenzoporphyrin derivative, phthalocyanine or a phthalocyanine derivative, perylene or a perylene derivative, coronene or a coronene derivative, heteroacene or a heteroacene derivative.

The organic semiconductor 5 may also be formed using, for example, spin coating, inkjet printing, and the like, and the coated or printed organic semiconductor material may be or include a polymer semiconductor material. Each or one of a source electrode 6 and a drain electrode 7 is electrically connected to the organic semiconductor 5 at both ends of the organic semiconductor 5. Herein, electrically connecting the source electrode 6 and the drain electrode 7 to the organic semiconductor 5 may refer to including a structure that directly connects the source electrode 6 and/or the drain electrode 7 to the organic semiconductor 5, and including a structure interposing a semi-conductive or conductive material therebetween.

As described above, the thin film transistor according to one example embodiment has a top contact structure in which organic semiconductor 5 and source electrode 6, and organic semiconductor 5 and drain electrode 7 are electrically connected above the organic semiconductor 5. The top contact structure may provide a stable channel of an organic semiconductor by ensuring the continuity of the organic semiconductor compared to a bottom contact in which the organic semiconductor and source electrode, and the organic semiconductor and drain electrode, are electrically connected under the organic semiconductor. In addition, the source electrode and the drain electrode are obtained by a process in that the electrode materials for the source electrode and the drain electrode are directly deposited on the organic semiconductor layer under vacuum to decrease contact resistance between the organic semiconductor and the source electrode, and between the organic semiconductor and the drain electrode.

The thin film transistor may be applied to various electronic devices such as a semiconductor device, a flat panel display, an energy device, and a sensor. The electronic device may include, for example, a liquid crystal display (LCD), an organic light emitting device, a solar cell, and an organic sensor.

Hereinafter, the thin film transistor according to another example embodiment is described with reference to FIG. 2.

Figure 2:
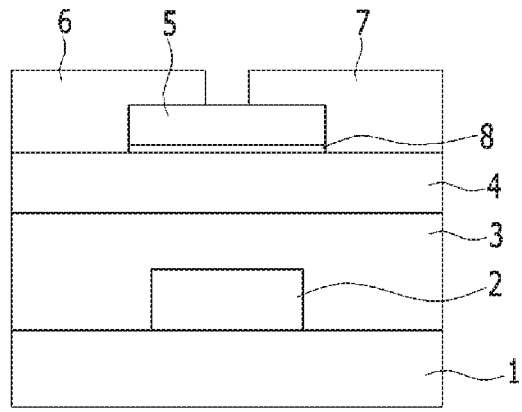
FIG. 2 is a cross-sectional view showing a thin film transistor according to another example embodiment.

FIG. 2 shows a thin film transistor including an additional thin film 8 between the organic insulation layer 4 and the organic semiconductor 5, unlike the thin film transistor shown in FIG. 1.

The additional thin film 8 may be obtained by forming, or may include, a self-assembled monolayer (SAM), forming a HMDS (hexamethyldisilazane: [(CH$_3$)$_3$Si]$_2$NH) film, or depositing a fluorine-based organic thin film, on the surface of organic insulation layer 4.

The self-assembled monolayer (SAM) may be formed by depositing a known organic material monomer capable of providing a self-assembled monolayer on the organic insulation layer 4. In this case, the surface of organic insulation layer 4 may be preliminarily treated by a method such as an oxygen plasma, a UV ozone, and the like, to sufficiently provide the self-assembled monolayer. Like this, by further including an additional thin film 8 between the organic insulation layer 4 and the organic semiconductor 5, the trap charging at the interface between the organic insulation layer 4 and the organic semiconductor 5 (interface trap charging) may be further reduced or substantially prevented.

Meanwhile, the additional thin film 8 between the organic insulation layer 4 and the organic semiconductor 5 may be generally formed in a bottom gate structure in which the gate electrode 2 is disposed under the organic semiconductor 5, as shown in FIG. 1 and FIG. 2.

Figure 3:
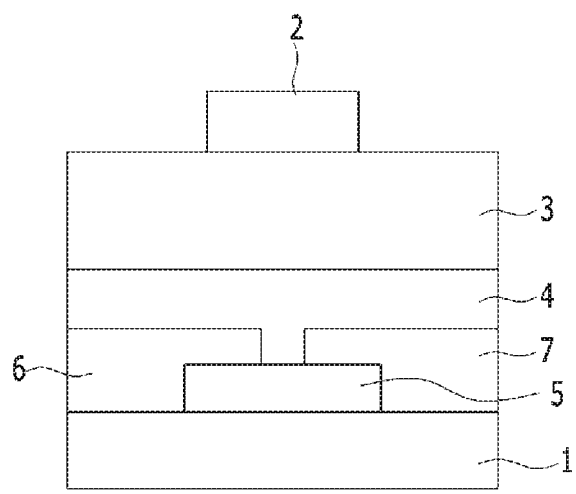
FIG. 3 is a cross-sectional view showing a thin film transistor according to further another example embodiment.

FIG. 3 shows a top gate structure in which a gate electrode 2 is disposed above an organic semiconductor 5. In this case, a material such as SAM may be deposited on the organic semiconductor 5 in order to provide an additional thin film between the organic semiconductor 5 and the organic insulation layer, which may not be provided because it may unfavorably deteriorate the conductivity of organic semiconductor 5 present in the lower part.

The material forming the self-assembled monolayer may include, for example, octadecyltrichlorosilane, octyltrichlorosilane, propyltrichlorosilane or the like, but is not limited thereto.

HMDS (hexamethyldisilazane), which is a compound having the following Structure 1, is a material having a high reactivity with hydroxyl group of the surface to convert the corresponding surface into a hydrophobic structure:

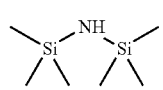

(Structure 1)

The fluorine-based organic thin film may also be formed using a fluorine-based organic material. For example, an additional thin film 8 may be formed by dissolving at least one material, as the fluorine-based organic material, selected from a perfluorinated polymer, polytetrafluoroethylene (PTFE), fluorinated ethylenepropylene (FEP), polyfluoroalkoxy, ethylene tetrafluoroethylene (ETFE), polyvinylidene fluoride (PVDF), perfluoro(alkenylvinyl ethers) or a combination thereof in an organic solvent to provide a solution, and coating the solution on the organic insulation layer 4 of FIG. 2 according to a solution process, for example, a spin coating, a slit coating, or an inkjet printing.

The coated fluorine-based organic thin film may be thermally cured.

Coating a fluorine-based organic thin film and thermally curing the same may each be performed at less than or about 150° C., for example, about 25° C. to about 150° C., or about 50° C. to about 150° C.

By providing an organic semiconductor 5 on the obtained additional thin film 8 as illustrated in FIG. 1, a thin film transistor may be obtained as shown in FIG. 2.

The thin film transistor shown in FIG. 2 may reduce or substantially suppress the bulk trap charging as the gate insulator includes the inorganic insulation layer 3 and the organic insulation layer 4, and may more effectively reduce or substantially suppress the interface trap charging generated at the interface between the organic insulation layer 4 and the organic semiconductor 5 by the additional thin film 8 formed on the organic insulation layer 4.

As understood from Comparative Example 2 described later, compared to the thin film transistor according to Comparative Example 1 (referring to FIG. 4) formed with a gate insulator including only an organic insulation layer 4 instead of a gate insulator including an inorganic insulation layer and an organic insulation layer, the thin film transistor according to Comparative Example 2 (referring to FIG. 5) in which a SAM monolayer 8 is formed on the surface of organic insulation film, and an organic semiconductor 5 is formed thereon, further increases a charge mobility and decreases a threshold voltage difference ($\Delta V_{TH}$), which confirms that the additional thin film 8 reduces or substantially suppresses the interface trap charging between the organic insulation layer 4 and the organic semiconductor 5.

FIG. 3 is a cross-sectional view showing a thin film transistor according to another example embodiment having a top gate structure in which the gate electrode 2 is disposed above the organic semiconductor 5.

As described above, the thin film transistor shown in FIG. 3 is different from the thin film transistors shown in FIG. 1 and FIG. 2, in having a top gate structure, where the organic semiconductor 5 is formed on the lower substrate 1, and the gate electrode 2 overlapped with the organic semiconductor 5 is disposed at an upper location of the organic semiconductor 5. However, the constituent elements in the thin film transistor are substantially equivalent to the thin film transistors shown in FIG. 1 and FIG. 2, but only the relative positions are different.

Specifically, at both ends of the organic semiconductor 5 formed on the substrate, a source electrode 6 and a drain electrode 7 may each be electrically connected to the organic semiconductor 5.

An organic insulation layer 4 is disposed on the organic semiconductor 5 and the source electrode 6 and the drain electrode 7 formed thereon, as a part of the gate insulator, and an inorganic insulation layer 3 is disposed on the organic insulation layer 4. A gate electrode 2 is disposed on the inorganic insulation layer 3.

Figure 4:
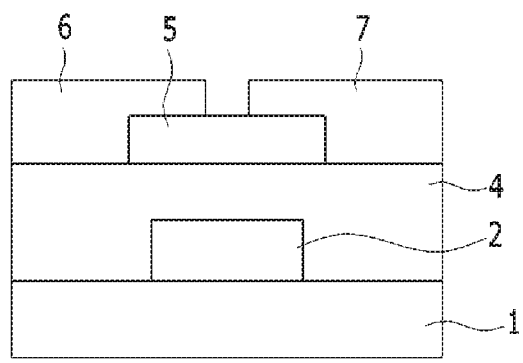
FIG. 4 is a cross-sectional view showing a thin film transistor according to Comparative Example 1.

FIG. 4 is a schematic cross-sectional view showing a thin film transistor according to Comparative Example 1.

Referring to FIG. 4, a gate electrode 2 is formed on a substrate 1, and an organic insulation layer 4 is formed thereon as a gate insulator. An organic semiconductor 5 is formed on the organic insulation layer 4, a source electrode 6 and a drain electrode 7 are formed on both ends of the organic semiconductor 5 and electrically connected to the organic semiconductor 5.

Hereinafter, a method of manufacturing a thin film transistor is described in detail with reference to FIG. 1.

First, a conductive layer is deposited on a substrate 1 according to a sputtering or thermal evaporation method, to provide a gate electrode 2, and an inorganic insulation layer 3 is formed thereon as a gate insulator. The inorganic insulation layer 3 is formed by depositing silicon oxide, silicon nitride, aluminum oxide, or the like, according to PECVD or ALD in a thickness that is less than or equal to about 200 nm, for example, less than or equal to about 150 nm, for example, less than or equal to about 100 nm, for example, less than or equal to about 50 nm.

Subsequently, the organic polymer or the siloxane-based organic/inorganic hybrid polymer may be formed on the inorganic insulation layer 3 according to, for example, a dry process such as a chemical vapor deposition (CVD) or a solution process such as spin coating, inkjet printing, and the like, to provide an organic insulation layer 4. The organic insulation layer is coated in a thickness that is less than or equal to about 200 nm, for example, less than or equal to about 150 nm, for example, less than or equal to about 100 nm, for example, less than or equal to about 50 nm.

The organic semiconductor 5 may be coated on the organic insulation layer 4 according to a vacuum deposition, a spin coating, an inkjet printing, and the like. After forming the organic semiconductor 5, a source electrode 6 and a drain electrode 7 are formed on both ends of the organic semiconductor 5 according to a thermal deposition (Vacuum Thermal Evaporation), sputtering, e-Beam evaporation, and the like, to provide a thin film transistor shown in FIG. 1.

In example embodiments, if an additional thin film 8 is provided between the organic insulation layer 4 and the organic semiconductor 5, as in the thin film transistor of FIG. 2, after providing the organic insulation layer 4, the additional thin film 8 is formed using SAM, HDMS, or an organic fluorine-based compound on the organic insulation layer 4 according to the known method, and then the organic semiconductor 5 and the source electrode 6 and the drain electrode 7, which are electrically connected thereto, may be formed thereon.

Hereinafter, the various embodiments are illustrated in more detail with reference to examples. However, the current scope is not limited thereto.

Fabrication of Thin Film Transistor

Example 1

Molybdenum is deposited on a glass substrate at a thickness of about 1,000 Å according to a sputtering method, and patterned according to photolithography to provide a gate electrode. AlOx is deposited on the gate electrode according to an ALD process in a thickness of about 30 nm, a siloxane copolymer represented by the following Chemical Formula 2 is spin coated thereon and cured at about 180° C. to provide an organic/inorganic composite insulation layer having a thickness of about 60 nm. Subsequently, the organic semiconductor material represented by the following Chemical Formula 3 is vacuum deposited at a thickness of about 700 Å, and a gold (Au) electrode is deposited (Vacuum Thermal Evaporation) thereon at a thickness of about 1,000 Å to provide a source electrode and a drain electrode. In order to protect the surface of the obtained thin film transistor, CYTOP (CTL-809M) is passivated at a thickness of about 1 μm to provide a thin film transistor.

[Chemical Formula 2]

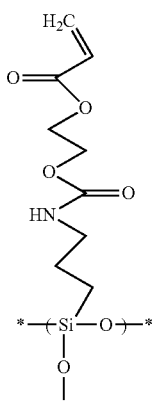

[Chemical Formula 3]

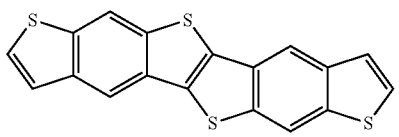

Example 2

Molybdenum is deposited on a glass substrate at a thickness of about 1,000 Å via sputtering, and patterned via a photolithography process to provide a gate electrode. AlOx is deposited on the gate electrode according to ALD process at a thickness of about 30 nm, and a poly (methylmethacrylate) polymer is spin coated thereon and heated at about 120° C. to provide an organic/inorganic insulation layer having a thickness of about 60 nm.

On the insulation layer, the organic semiconductor material represented by Chemical Formula 3 is vacuum-deposited at a thickness of about 700 Å, and a gold (Au) electrode is deposited (via Vacuum Thermal Evaporation) at a thickness of about 1,000 Å to provide a source electrode and a drain electrode. In order to protect the obtained thin film transistor, CYTOP (CTL-809M) is passivated at a thickness of about 1 μm to provide a thin film transistor.

Comparative Example 1

Molybdenum is deposited on a glass substrate at a thickness of about 1,000 Å via sputtering and patterned via a photolithography process to provide a gate electrode. An organic insulation layer including a siloxane copolymer represented by Chemical Formula 2 is spin-coated on the gate electrode and heated at about 180° C. to coat at a thickness of about 350 nm. Subsequently, the organic semiconductor material represented by the following Chemical Formula 3 is vacuum deposited at a thickness of about 700 Å, and a gold (Au) electrode is deposited (via Vacuum Thermal Evaporation) thereon at a thickness of about 1,000 Å to provide a source electrode and a drain electrode. In order to protect the obtained thin film transistor, CYTOP (CTL-809M) is passivated at a thickness of about 1 μm to provide a thin film transistor.

Comparative Example 2

Molybdenum is deposited on a glass substrate at a thickness of about 1,000 Å according to sputtering and patterned according to a photolithography process to provide a gate electrode. An organic insulation layer including a siloxane copolymer represented by Chemical Formula 2 is spin-coated on the gate electrode and then heated at about 180° C. to coat a thickness of about 350 nm. The organic/inorganic composite insulation layer is activated on the surface according to the oxygen plasma process, and a self-assembled monolayer is formed using octadecyltrichlorosilane (ODTS).

Subsequently, the organic semiconductor material represented by the following Chemical Formula 3 is vacuum deposited at a thickness of about 700 Å, and an Au electrode is deposited (via Vacuum Thermal Evaporation) thereon at a thickness of about 1,000 Å to provide a source electrode and a drain electrode. In order to protect the obtained thin film transistor, CYTOP (CTL-809M) is passivated at a thickness of about 1 μm to provide a thin film transistor.

Evaluation

The thin film transistors obtained from Example 1 and Example 2 and Comparative Example 1 and Comparative Example 2 are evaluated for the characteristics according to NBTI.

Specifically, after measuring the initial characteristics of each thin film transistor, the temperature is increased up to about 70° C., and each or one or more thin film transistor is subjected to a gate voltage corresponding to about 1 MV/cm for about 10 hours and cooled down to a room temperature, and the final transistor characteristics are evaluated.

The results are shown in FIG. 5 to FIG. 8.

Figure 5:
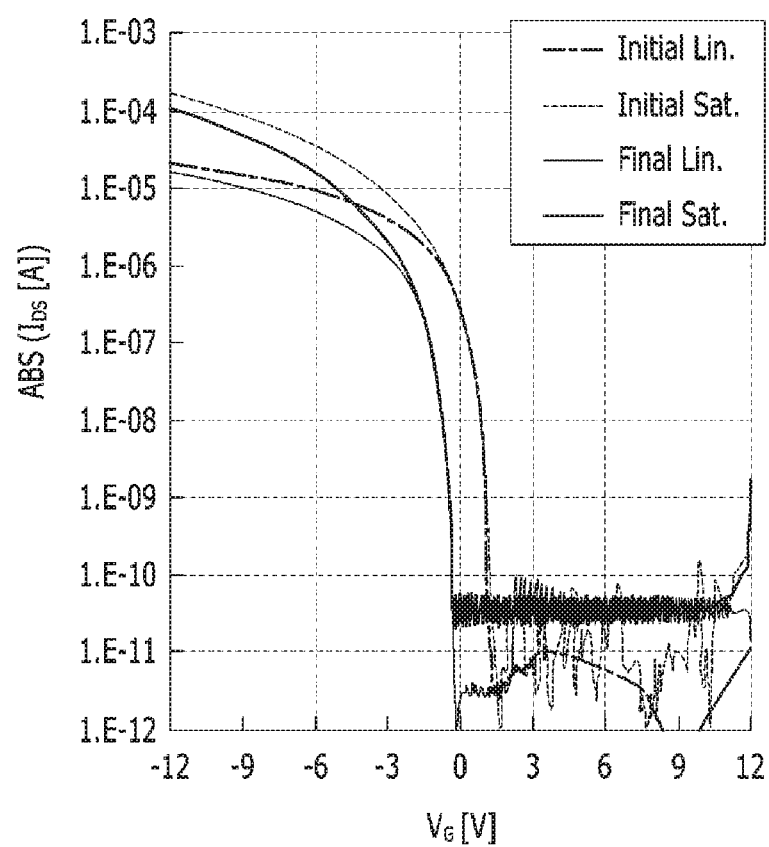
FIG. 5 is a graph showing a charge mobility of a thin film transistor according to Example 1.
Figure 6:
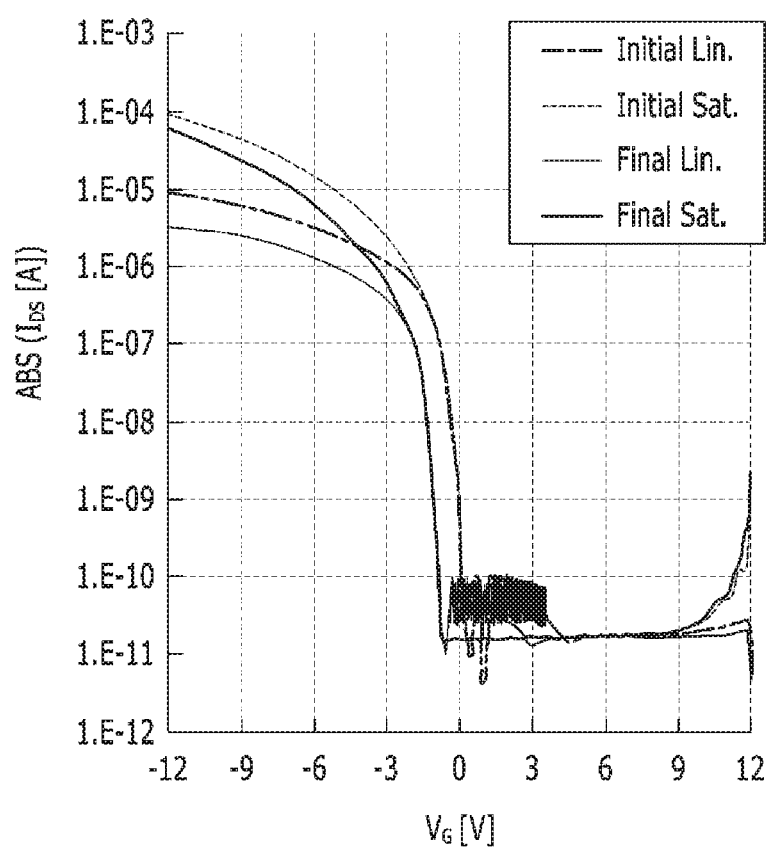
FIG. 6 is a graph showing a charge mobility of a thin film transistor according to Example 2.
Figure 7:
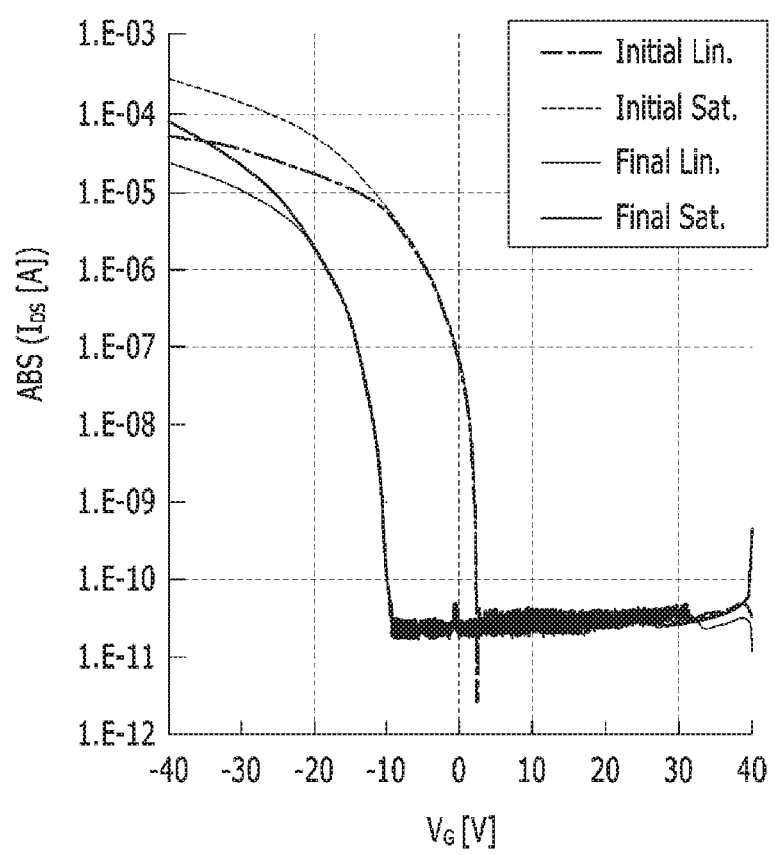
FIG. 7 is a graph showing a charge mobility of a thin film transistor according to Comparative Example 1.
Figure 8:
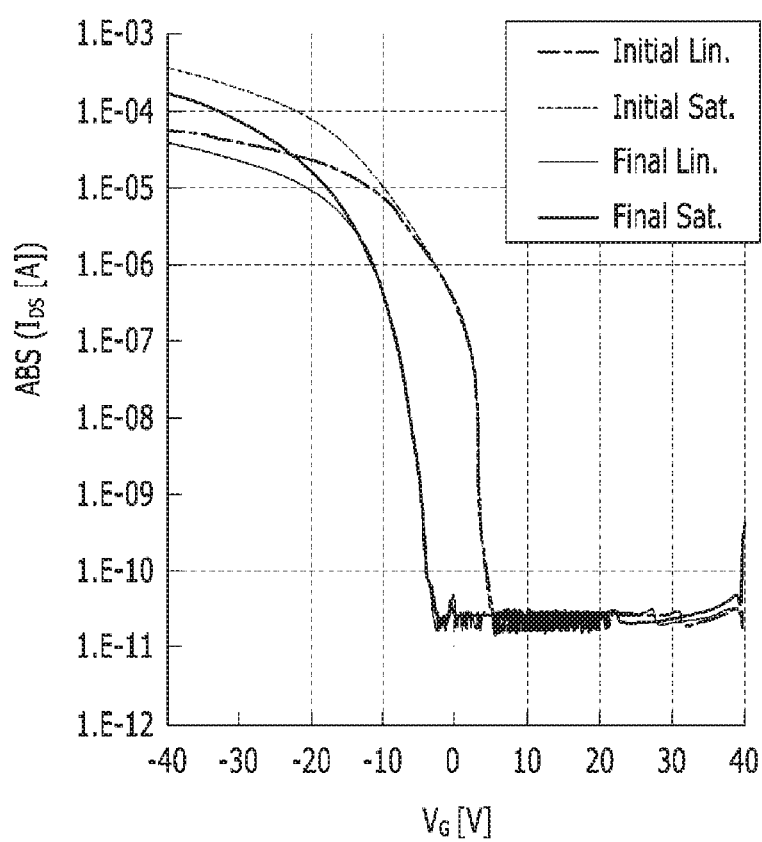
FIG. 8 is a graph showing a charge mobility of a thin film transistor according to Comparative Example 2.

FIG. 5 is a graph illustrating transfer characteristics of a thin film transistor according to Example 1; FIG. 6 is a graph illustrating transfer characteristics of a thin film transistor according to Example 2; FIG. 7 is a graph illustrating transfer characteristics of a thin film transistor according to Comparative Example 1; and FIG. 8 is a graph illustrating transfer characteristics of a thin film transistor according to Comparative Example 2.

From each graph, the threshold voltage difference $\Delta V_{TH}$ is calculated after the NBTI test of each thin film transistor, and the results are shown in the following Table 1.

TABLE 1

|  | Example 1 | Example 2 | Comparative Example 1 | Comparative Example 2 |
|---|---|---|---|---|
| $\Delta V_{TH}$ | 1.5 V | 0.9 V | 12.5 V | 8.0 V |

Referring to Table 1, the thin film transistors according to Example 1 and Example 2 having a composite insulation layer structure including an inorganic insulation layer and an organic insulation layer as a gate insulator have a significantly lower threshold voltage difference after the NBTI test than in Comparative Example 1 which include an organic insulation layer, or in Comparative Example 2 which include a self-assembled monolayer (SAM) formed on the organic insulation layer, so it is understood that the NBTI characteristics are remarkably improved.

While this disclosure has been described in connection with what is presently considered to be example embodiments, it is to be understood that the current scope is not limited to the example embodiments, but, on the contrary, is intended to cover various modifications and equivalent arrangements included within the spirit and scope of the appended claims.

What is claimed is:

1. A thin film transistor comprising:
a gate electrode,
a semiconductor overlapping the gate electrode,
a gate insulator between the gate electrode and the semiconductor, and
at least one of a source electrode or a drain electrode electrically connected to the semiconductor,
wherein the gate insulator includes an inorganic insulation layer in contact with the gate electrode and an organic insulation layer in contact with the semiconductor, and
wherein the organic insulation layer comprises a siloxane copolymer comprising a structural unit represented by Chemical Formula 2:

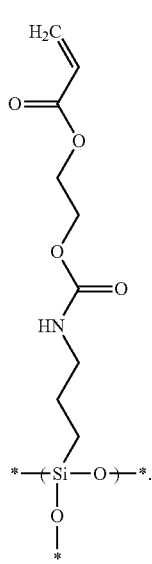

Chemical Formula 2

2. The thin film transistor of claim 1, wherein the inorganic insulation layer comprises at least one of SiOx, SiNx, AlOx, or a combination thereof.

3. The thin film transistor of claim 1, wherein the inorganic insulation layer has a thickness that is less than or equal to about 200 nm.

4. The thin film transistor of claim 1, wherein the organic insulation layer has a thickness that is less than or equal to about 200 nm.

5. The thin film transistor of claim 1, wherein the gate electrode is on a substrate and the thin film transistor further comprises a self-assembled monolayer (SAM), a HMDS (hexamethyldisilazane) film, or a fluorine-based organic thin film between the organic insulation layer and the semiconductor.

6. The thin film transistor of claim 5, wherein the substrate comprises a silica, glass, or plastic substrate.

7. The thin film transistor of claim 1, wherein the semiconductor comprises an organic semiconductor.

8. The thin film transistor of claim 1, wherein the gate electrode is on a substrate and the thin film transistor further comprises a self-assembled monolayer (SAM) or a HMDS (hexamethyldisilazane) film between the organic insulation layer and the semiconductor.

9. A method of manufacturing a thin film transistor, comprising:
providing a gate electrode,
providing a gate insulator on the gate electrode,
providing an organic semiconductor on the gate insulator, and
electrically connecting at least one of a source electrode or a drain electrode to the organic semiconductor on the organic semiconductor,
wherein providing the gate insulator on the gate electrode includes,
providing an inorganic insulation layer on the gate electrode, and
providing an organic insulation layer on the inorganic insulation layer,
wherein the organic insulation layer comprises a siloxane copolymer comprising a structural unit represented by Chemical Formula 2:

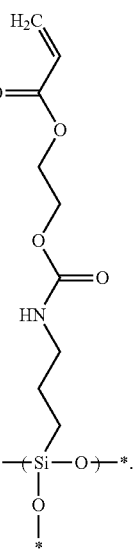

Chemical Formula 2

10. The method of claim 9, wherein the providing the inorganic insulation layer comprises depositing SiOx, SiNx, AlOx, or a combination thereof at a thickness of less than or equal to about 200 nm using a plasma enhanced chemical vapor deposition (PECVD) method or an atomic layer deposition method (ALD).

11. The method of claim 9, wherein the providing the organic semiconductor comprises using solution coating or deposition.

12. The method of claim 9, wherein the method further comprises:
forming a self-assembled monolayer (SAM), a HMDS (hexamethyldisilazane) film, or a fluorine-based organic thin film on the organic insulation layer.

13. The method of claim 9, wherein the gate electrode is on a substrate and the method further comprises providing a self-assembled monolayer (SAM) or a HMDS (hexamethyldisilazane) film between the organic insulation layer and the organic semiconductor.

14. A method of manufacturing a thin film transistor, comprising:
providing an organic semiconductor;
electrically connecting at least one of a source electrode or a drain electrode to an end of the organic semiconductor;
providing a gate insulator on the source electrode, the drain electrode and the organic semiconductor;
providing a gate electrode on the gate insulator, wherein the providing the gate insulator includes,
  providing an organic insulation layer on the source electrode, the drain electrode and the organic semiconductor, and
  providing an inorganic insulation layer on the organic insulation layer, wherein the organic insulation layer comprises a siloxane copolymer comprising a structural unit represented by Chemical Formula 2:

Chemical Formula 2

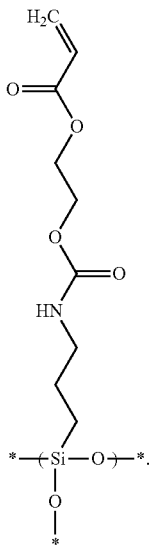

15. An electronic device comprising a thin film transistor, wherein the thin film transistor comprises:
  a gate electrode,
  a semiconductor overlapping the gate electrode,
  a gate insulator between the gate electrode and the semiconductor, and
  at least one of a source electrode or a drain electrode electrically connected to the semiconductor, wherein the gate insulator includes an inorganic insulation layer in contact with the gate electrode and an organic insulation layer in contact with the semiconductor, and
wherein the organic insulation layer comprises a siloxane copolymer comprising a structural unit represented by Chemical Formula 2:

Chemical Formula 2

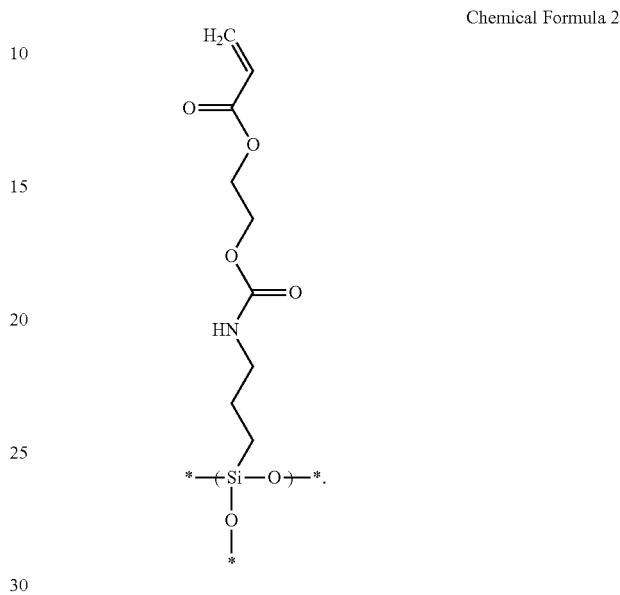

16. The electronic device of claim 15, wherein the electronic device comprises a liquid crystal display (LCD), an organic light emitting diode device, an electrophoretic display, or an organic sensor.

17. The electronic device of claim 15, wherein the gate electrode is on a substrate and the electronic device further comprises a self-assembled monolayer (SAM) or a HMDS (hexamethyldisilazane) film between the organic insulation layer and the semiconductor.

* * * * *